ELASTIC WAVE DELAY AND PARAMETRIC AMPLIFIER

INVENTORS
RICHARD A. SPARKS
EDGAR L. HIGGINS

BY Alfred B. Levine
ATTORNEY

INVENTORS
RICHARD A. SPARKS
EDGAR L. HIGGINS
BY Alfred B. Levine
ATTORNEY

INVENTORS
RICHARD A. SPARKS
EDGAR L. HIGGINS

BY Alfred B. Levine
ATTORNEY

United States Patent Office 3,445,774

Patented May 20, 1969

3,445,774

ELASTIC WAVE DELAY AND PARAMETRIC AMPLIFIER

Richard A. Sparks, Bedford, Mass., and Edgar L. Higgins, Hyattsville, Md., assignors to Litton Systems, Inc., Silver Spring, Md., a corporation of Delaware Filed Dec. 28, 1966, Ser. No. 605,480
Int. Cl. H03f 7/06; H03h 7/30
U.S. Cl. 330—4.6 3 Claims

ABSTRACT OF THE DISCLOSURE

An integral adjustable delay and parametric amplifier employing elastic wave transmission in single crystals characterized by producing controllable delay and amplification wherein a continuous wave pumping signal is applied and the magnetic biasing of the crystal for amplification is provided at an angle of less than five degrees and greater than 1½ degrees.

This invention relates to a parametric device and more particularly to such a device that functions as both a delay line and as an amplifier.

Copending U.S. patent applications Ser. No. 494,461 filed Oct. 11, 1965, entitled, Delay Line, and Ser. No. 500,648, filed Oct. 22, 1965, and now abandoned entitled, Variable Delay Line, by the same inventors, disclose novel miniature delay lines utilizing ferrimagnetic crystalline material that are capable of operation well within the microwave frequency bands at normal ambient temperatures.

The present invention provides a miniaturized amplifier and delay line in one integral structure that is similar to those described in said applications and provides novel means and methods for the generation, parametric amplification, and delay of elastic waves in single solid crystalline ferrigmagnetic insulating devices.

Parametric amplification and delay of elastic waves in solid ferrimagnetic insulating crystals, such as yttrium iron garnet, hereinafter referred to as YIG, has been accomplished in the past only under controlled laboratory conditions that require the use of large electromagnets as a source of bias for crystal, together with refrigerants to reduce the noise level, and pulsed pump source signals set at precisely twice the frequency of the input signal frequency. In such systems only a quasi-degenerative mode-of-operation has been obtainable.

Furthermore in prior art devices, the signal frequency (ws) must precisely equal one-half of the pump frequency (wp) or $wp=2Ws$ within limits of less than 1% to attain any recognizable output signal, and therefore the signal frequency must be precisely known and the pump signal source must be precisely phase and frequency locked to the signal.

The present invention provides a parametric amplifier and delay device using a pumping source of continuous wave microwave frequency signals that may be operated in either a quasi-degenerative mode or a nondegenerative mode. The ability to operate in these modes provides a substantial increase in amplification of input signals as well as a wider range of phase delay capability. It also provides a considerable reduction in noise and a large available band of operation within the microwave spectrum at ambient or room temperatures. In addition to these advantages the present invention provides a device that is suitable for use in practical applications outside of the laboratory since a preferred embodiment is structurally compact and light weight, requires a very low power control source and pump source, and obviates the need for refrigerants.

It is accordingly an object of the present invention to provide a miniaturized amplifier and delay line capable of operation at microwave frequencies and operable at normal room temperatures.

A further object is to provide a combined amplifier and delay line in one integrated miniature structure capable of operation over a wide band of microwave frequencies.

Still a further object is to provide a solid state parametric amplifier-delay line which operates at microwave frequencies, is noise and distortion free, requires extremely low power, and operates at room ambient temperatures.

These and other advantages of the invention will be more fully understood from the following description taken with the accompanying drawings as follows.

Figure 1:
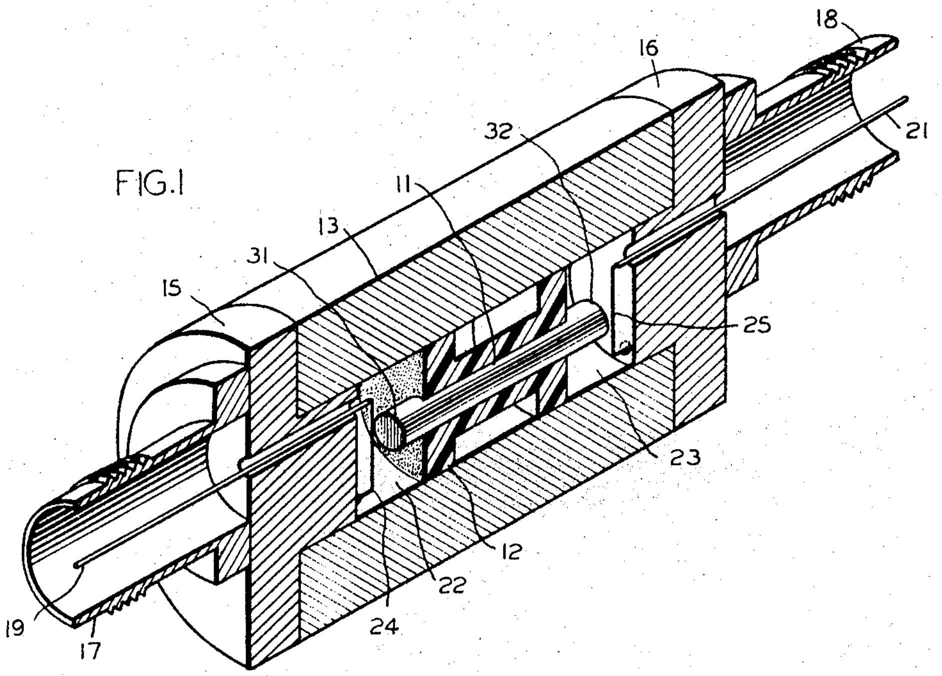
FIG. 1 shows a isometric sectional view of one embodiment of the invention.

Turning now to FIG. 1 there is shown a sectional perspective view of an embodiment of the present invention employing a synthetic ferrimagnetic single crystal rod or bar 11 with end faces 31 and 32 supported inside a spool shaped holder 12 which in turn is supported inside a permanent magnet 13.

The crystal 11 may be made of any synthetic ferrimagnetic material, such as yttrium iron garnet (YIG); a yttrium iron garnet doped with a suitable metal such as gallium, aluminum and the like; hexogonal ferrites, such as lithium ferrite, zinc ferrite; or similar materials. Further, the crystal may assume any ellipsoidal shape, (spherical, disc shaped, or the like); or any "non-ellipsoidal" shape. The term "non-ellipsoidal" as used herein to refers to any quasi-ellipsoidal shape excluding grossly asymmetrical configurations.

The crystal holder 12 may be made of a cylinder of metallic material, such as brass, or may be of a dielectric material, such as nylon for example, so long as the end faces are coated with a conductive material. In order to reduce its weight, the holder is preferably spool shaped as shown in FIG. 1. The magnet 13 may be made of materials such as Alnico alloys.

Each of the end faces of the magnet 13 are closed by re-entry pole pieces 15 and 16. An aperture is formed within the pole pieces to which coaxial cable connectors 17 and 18 are secured both mechanically and electrically. Coaxial cable center conductors 19 and 21 are placed in these apertures. It is noted that cavities 22 and 23 are formed between the end faces of the pole pieces 15 and 16, portions of the interior surface of the magnet 13, the end faces 31 and 32 of the crystal 11, and the end pieces of holder 12. Electromagnetic probes such as fine wire loops 24 and 25 are placed in these cavities and are each connected at one end to their respective center conductors 19 and 21, and the other ends thereof are soldered to the interior faces of the pole pieces 15 and 16, respectively, to provide an electrical ground connection.

According to the present invention it has been found that optimum amplification is obtained when the angle of application of the magnetic field to the crystal is less than 5 degrees with a preferred range of cant of the magnetic field to the crystal being between 1½ to 4 degrees. To obtain this angular application of the magnetic field to the crystal, the crystal 11 may be supported in a non-coaxial manner within its holder 12.

Connected to the coaxial connector 17, via suitable coaxail cable (not shown) is applied a source of input signals (not shown) operating at a typical frequency value of about one gc./sec. in a pulsed wave. Connected to the other coaxial connected 18, via a suitable coaxial cable (not shown), is a source of pumping signal. The output signal from the device may be taken from either connector 17 or 18 through a suitable separation or directional network (not shown), such as a circulator or the like.

Assuming for purposes of explanation, that the pump signal is not applied and an input signal is applied at conductors 17, 19 and an output signal taken from connector 12, 21. With the proper biasing by magnet 13, wave propagation occurs within the crystal in either of two modes; an elastic wave propagation mode or a magnetoelastic wave mode.

Figure 2:
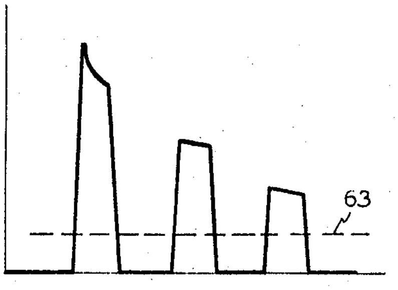
FIG. 2 is a graph of time vs. amplitude of the output signal obtained from the device without the application of pump signals.

Briefly, in the elastic wave mode, the crystal 11 acts as an electromagnetic energy converter or transducer. Thus, an electrical signal injected into the device at connector end 17, passes down the coaxial cable center conductor 19 to the fine wire loop 24, and the field from loop 24 is applied at one end of the crystal. When the flux field from the permanent magnet 13 properly biases the crystal 11 close to ferrimagnetic resonance at the frequency of this input signal, the electromagnetic field is converted to elastic vibrational energy at the surface 31 of the crystal and propagates the length of the crystal rod 11. At the other end 32 of he rod 11, a portion of the elastic energy is reconverted to electromagnetic energy and is coupled to the output circuit (not shown) via wire loop 25 and center conductor 21. The remainder of the elastic wave is reflected from this end surface 32 and is returned to the input end surface 31 where this propagation cycle is repeated. Reflection and conversion of the wave continues in this manner until all of the energy is expended within the crystal and coupled outwardly through the loops 24 and 25. By proper choice of crystal material size, structure, orientation, biasing fields, and frequencies of operation, a progressively damped pulse train occurs at the output, as shown in FIG. 2, or a selected one or selected ones of such output pulses may exceed others.

Figure 3:
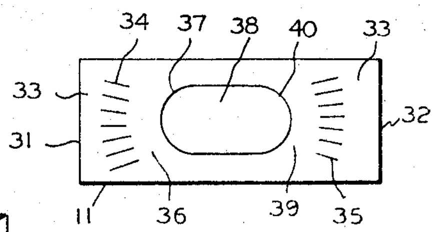
FIG. 3 is a pictorial representation of the various magnetic boundaries in the crystal.

Turning now to FIG. 3 in conjunction with FIG. 1, for an understanding of the theory of propagation in the magnetoelastic wave mode. FIG. 3 is a pictorial representation of the magnetic fields and boundaries created within the crystalline structure as pictured during operation in this mode. The crystal 11 is divided into three distinct areas: (1) the end areas 33 between crystal and surface 31, 32 and a small region of the crystal designated as the crossover regions 34, 35; (2) the areas 36, 39 between the crossover regions 34, 35 and a region or zone designated the turning points 37, 40 and (3) the area 38 bounded by the turning points 37, 40.

Electromagnetic energy that is injected into the crystal penetrates through the crystal end 31 to the turning point 37 where it is converted to a spin wave. The spin wave is presented with a lower energy internal magnetic field or gradient in the direction of end face 31 than that field present in the area designated 38 and hence is directed backwardly to region 34 where the energy is converted into an elliptically polarized elastic wave. This elastic wave continues toward face 31 and is reflected from the surface 31. Part of the reflected wave is altered in polarization (termed improperly polarized), and the rest of the wave remains unchanged and in the proper polarization.

The improperly polarized wave propagates in a return path through the center crystal length to the other end face or surface 32 and is reflected so that a portion of this wave again becomes properly polarized. This properly polarized portion passes back through region 35 where it is reconverted to a spin wave. In continuing and traversing region 39, the spin wave encounters turning point 40 where it is again reconverted to electromechanical energy. This last mentioned energy wave is extracted from the crystal by means of loop 24 and transmitted via center conductor 19, constiuting the first transmitted pulse.

The properly polarized wave portion at face 31 propagates through region 34 where it is reconverted to a spin wave and thereafter encounters turning point 37. At this turning point a segment of this spin wave will be converted to electromagnetic energy. The energy will be reflected and coupled to loop 24. The other portion will remain spin wave energy and be propagated toward the other end face 32 and the cycle continues as described above.

Figure 4:
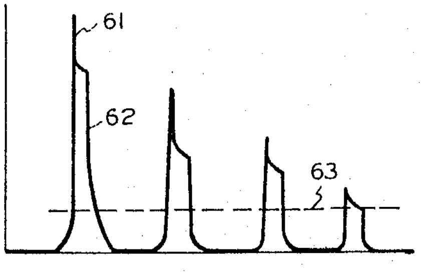
FIG. 4 is a graph of time vs. amplitude of an output signal from a similar prior art device with a pump signal applied.

As described above, experiments have been conducted in the past utilizing a pumped pulse source set at substantially twice the frequency of input pulses. The output signals taken from such prior art devices are as shown in FIG. 4 wherein the pulses produced have a transient spike that occurs at the leading edge 61 and rapidly falls away in roughly an exponential decay 62. These "spike pulses" have been exhibited regardless of the pulse width.

By applying a continuous wave pump source to the device of the present invention, the desirable modes of operation as described hereinbefore are obtained, namely the continuous wave quasi-degenerative mode and the continuous wave nondegenerative mode. A typical output signal of the device of the present invention utilizing a CW pump signal is as shown in FIG. 5.

Figure 5:
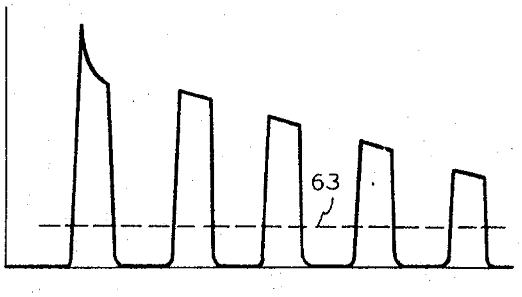
FIG. 5 is a similar graph of time vs. output signal amplitude of the device of the present invention with a pump signal applied.

Applying a CW wave pump signal at a frequency Wp to terminal 18, where the pump signal frequency is made twice that of the signal frequency results in both diminishing the undesired transient "spike" mode, as well as providing additional signals as shown in FIG. 5. All of these output signals are amplified over their entire pulse width rather than exhibiting the "spike gain" characteristic shown in the transient mode of the prior art.

Figure 8:
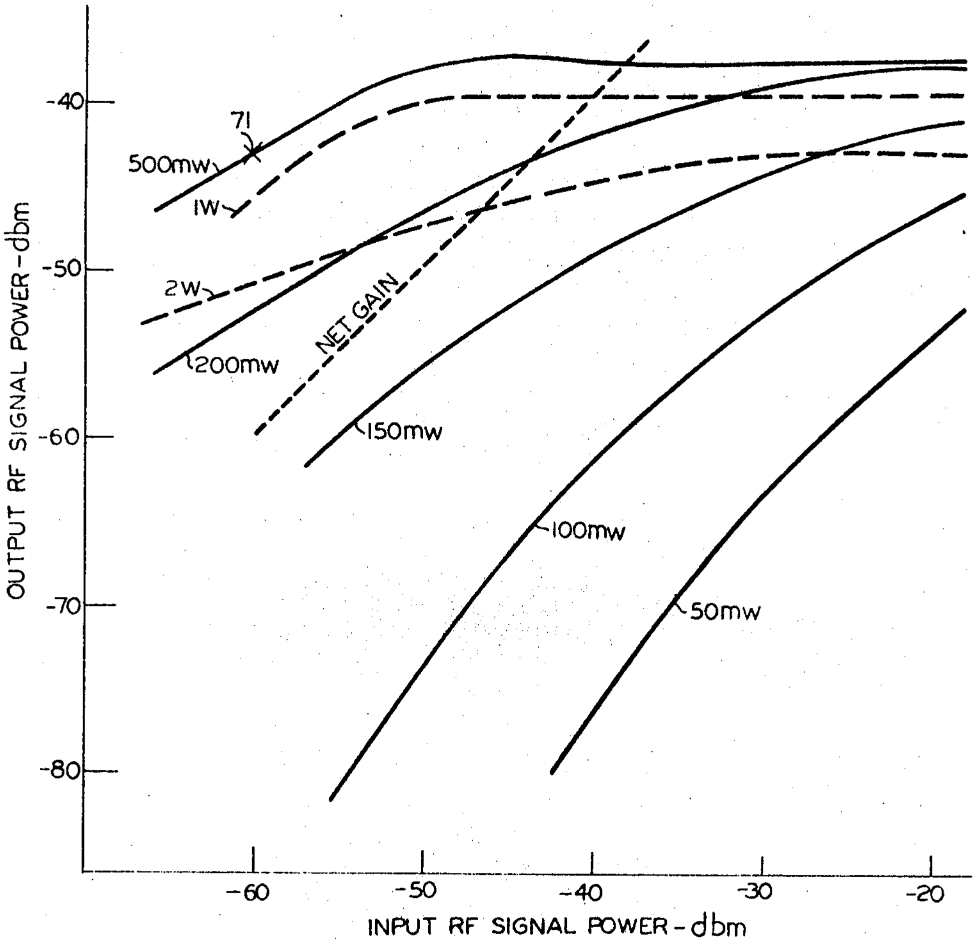
FIG. 8 is a family of curves for various pump signal power levels showing output vs. input power.

According to the invention, it has been found that to obtain amplification from the device there exists a critical relationship between the pumping power and the intelligence signal power, when operating in the quasi-degenerate mode. FIG. 8 shows a family of curves of input R-F signal power versus output R-F power as a function of pump power, for a signal frequency of 1.0 gc./sec., a pump frequency of 2 gc./sec., and a dc magnetic field of 1200 gauss. The linear dotted line shows the dividing line necessary for net gain. Any curves or portions of the curves above this "net gain" dotted line indicate a net gain in the system, and portions below the line are indicative of operation without net gain or attenuation. It is seen that at these input power levels, no net gain is exhibited until the pump power level is above 150 mw. At the 200 mw. pump power level, the curve shows amplification over approximately half the range of input signals. At 500 mw. pump power, the gain of the system was 17 db with a signal input of 60 dbm as shown at the point in the curve designated by reference numeral 71. It is of interest to note that at pump power levels above 500 mw., that is at pump powers of 1 watt or 2 watts, the gain is less than that at 500 mw. pump powers.

Figure 6:
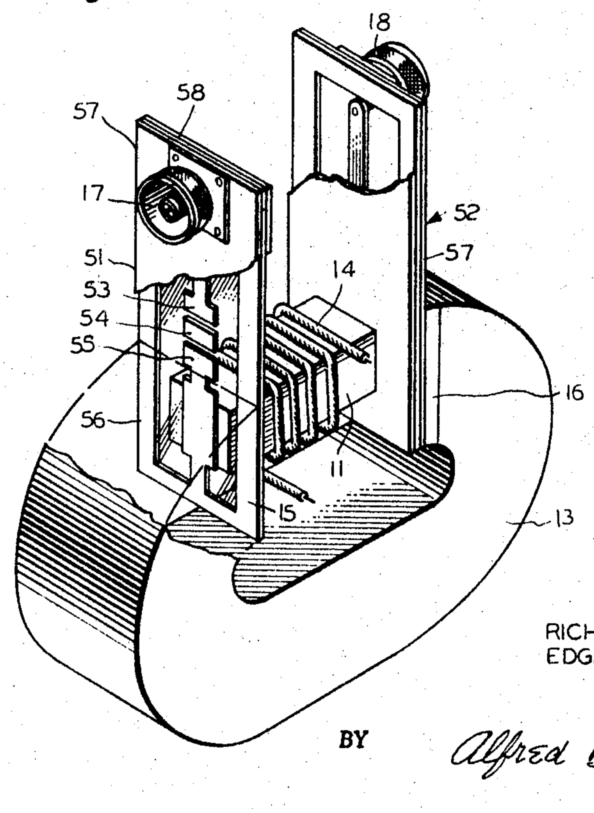
FIG. 6 is a perspective view of another embodiment of the invention.

Many other configurations of the permanent magnet may be used in addition to that shown in FIG. 1. FIG. 6 illustrates a rod or bar 11 placed within the air gap of a "C" type permanent magnet 13 having pole pieces 15 and 16. These pole pieces may be placed against the end surfaces of the magnet (as shown) or may be encased into the magnet itself. Between and touching the pole piece 15 and the bar or rod 11 is a printed circuit board 51. Similarly, an identical printed circuit board 52 is placed between pole pieces 15 and the crystal 11. The boards 51 and 52 have fastened thereto connectors 18 and 17 respectively, serving as input and output terminals to the device. The boards 51 and 52 comprise a conductive material in the form of a transmission line strip having matching sections 53 and 55 of the general shape of a "T," while section 54 may be rectangular in shape. Sections 53 to 55 are framed by a rectangular conductive strip 56 which is of substantially the dimensions of the board 51 itself. Dielectric material 57 and 58 sandwiches the conductive strip providing insulation, rigidity and support therefore. The conductive strip may be a solid conductor as shown or may consist of a further dielectric board having a thin conductive material deposited on one or both sides thereof which material is selectively etched away to give the desired configuration. The entire device, after assembly, may be secured in place by mechanical structure, may be epoxied to the magnet, or may be secured in other well known fashions.

As discussed in the earlier filed applications, the time delay provided by these devices may be preadjusted by changing the strength of the magnet, the orientation of the crystal or by any combination of these factors.

For changing the strength of the magnet to vary the time delay a tickler coil 14, shown in FIG. 6, is wound about the crystal 11. Such a coil may be wound about the spool 12 in the embodiment of FIG. 1. By energizing this coil 14 with a source of DC bias potential, the effective bias of the device may be changed. This may be pictured in FIG. 3 as effecting a change in the relative dimensions of the various zones in the crystal.

Figure 7:
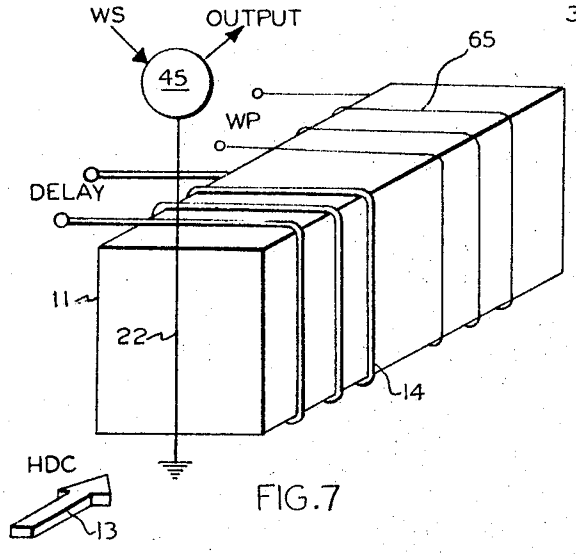
FIG. 7 is a schematic view of a still further embodiment.

A still further embodiment is shown schematically in FIG. 7. A crystal rod 11 is biased by a DC magnetic flux, for example as is shown in FIGS. 1 or 6. An input-output loop 22 is connected at one end to a suitable circulator 45 or the like and at the other end is placed adjacent one end face of the crystal 11. A tickler or delay coil 14 wound about the crystal serves to vary the time delay of pulses in the crystal. And a second wire coil 65 is wound about another section of the crystal. The input energy is applied via circulator 45 to the crystal end surface and a suitable current is applied to coil 14 to magnetically bias the crystal and may be variable to control the time delay provided by the unit. The pump energy is coupled to the crystal by the use of the coil 65 rather than an end loop near the opposite end of the crystal. A further coil of fine wire (not shown) may be wound about the crystal to operate in the transmissive mode rather than reflective as shown. Or an additional wire loop similar to loop 25 in FIG. 1 may be placed adjacent crystal end face 32.

In one device that has been constructed and used, the crystal was provided in the form of a cylinder of one centimeter in length and three millimeters in diameter. Although the optimum dimensions of the crystal necessary to achieve amplification are not shown, it has been found that the ratio of crystal length to diameter must be greater than 1. The frequency to which the crystal is tuned is directly proportional to the strength of the internal magnetic field. The diameter and length of the crystal for any given external magnetic field will determine the focus configuration and hence determine the internal magnetic field in the crystal. Therefore, it is believed that this aspect ratio (length to diameter) and the diameter of the crystal are important parameters which determine whether or not the device will operate as an amplifier.

Although but limited embodiments of the invention have been illustrated and described, many changes may be made without departing from the spirit and scope of this invention. Accordingly this invention should be considered as being limited only by the following claims:

What is claimed is:

1. An elastic wave parametric amplifier comprising: a ferrimagnetic crystal, means for applying a magnetic field to said crystal, a first electromagnetic probe means in proximity to said crystal energizable by an RF signal input for propagating an elastic wave in said crystal, a second electromagnetic probe means in proximity to said crystal energizable by a CW pump power signal for coupling said CW pump signal to said crystal, means for receiving an output signal from one of said first and second probes of greater power than the power of said input signal, and a magnet so aligned with the crystal as to provide a magnetic field oriented at an angle of from one and one-half to four degrees to the axis of said crystal, the relationship of the input signal power to the CW pump signal power to produce net amplification for a crystal of 1 cm. in length and 3 mm. in diameter being:

the pump power being greater than 150 mm. for signal powers greater than 40 dbm., with net gain progressively declining for pump powers exceeding 500 mw.

2. In the amplifier of claim 1, said crystal being supported within a hollow cylinder of magnetic material, and said permanent magnet comprising a pair of magnetic pole pieces closing the ends of said cylinder.

3. In the amplifier of claim 1, said electromagnetic probes having lead in portions passing through said magnetic probes.

References Cited

UNITED STATES PATENTS

| | | | |
|---|---|---|---|
| 3,215,944 | 11/1965 | Matthews | 330—4.6 |
| 3,290,610 | 12/1966 | Auld et al. | 330—4.6 |
| 3,244,993 | 4/1966 | Schloemann | 330—4.6 |
| 3,249,882 | 5/1966 | Stern | 330—4.6 |

OTHER REFERENCES

Sparks et al., Applied Physics Letters, July 15, 1965, pp. 41–43.

Comstock et al., Proc. IEEE, September 1965, pp. 1270–1271.

ROY LAKE, *Primary Examiner.*

D. R. HOSTETTER, *Assistant Examiner.*

U.S. Cl. X.R.

330—4.8, 5.5, 53; 333—30